United States Patent [19]

Wiedmann

[11] Patent Number: 4,596,000
[45] Date of Patent: Jun. 17, 1986

[54] SEMICONDUCTOR MEMORY

[75] Inventor: Siegfried K. Wiedmann, Stuttgart, Fed. Rep. of Germany

[73] Assignee: International Business Machines Corporation, Armonk, N.Y.

[21] Appl. No.: 602,866

[22] Filed: Apr. 23, 1984

[30] Foreign Application Priority Data

May 25, 1983 [EP] European Pat. Off. ......... 83105171.9

[51] Int. Cl.⁴ .............................................. G11C 11/40
[52] U.S. Cl. .................................... 365/174; 365/189
[58] Field of Search .................. 365/174, 189, 94, 230

[56] References Cited

U.S. PATENT DOCUMENTS 3,599,182  8/1971  Henle .................................. 365/227
3,959,781  5/1976  Mehta et al. ........................ 365/210
4,280,198  7/1981  Heuber et al. ...................... 365/203

FOREIGN PATENT DOCUMENTS 1569800  6/1980  United Kingdom .

Primary Examiner—Joseph A. Popek
Attorney, Agent, or Firm—Stephen J. Limanek

[57] ABSTRACT

A semiconductor memory is described, whose word lines are divided into several partial word lines or partitions, wherein each partial word line is connected to a word switch and all word switches of a word line are selected and controlled via a first word control line and a second word control line.

10 Claims, 4 Drawing Figures

SEMICONDUCTOR MEMORY

TECHNICAL FIELD

The invention relates to a semiconductor memory with static cells arranged at the cross point of word and bit lines and which are selected via selection circuits and control lines.

BACKGROUND ART

Semiconductor memories with cells in bipolar or merged transistor logic (MTL) technology are known in principle. In commonly assigned U.S. Pat. No. 4,280,198, filed Dec. 7, 1979, by K. Heuber and S. K. Wiedmann, a discharge process is described for such memories, which permits discharging capacitive currents on particular lines for faster reading and writing. MTL cells are described, for example, in commonly assigned United Kingdom Pat. No. 1,569,800 filed Mar. 2, 1977, by S. K. Wiedmann.

In addition, it is usual for the row and word lines of bipolar and FET memories to be divided into two parts. Such a memory is described, for example, in U.S. Pat. No. 3,959,781, filed by R. J. Mehta and M. Geilhufe on Nov. 4, 1974. This memory is characterized in that the row lines have right and left partitions, that a number of sense amplifiers corresponding to the number of row lines are arranged in a column such that each of the amplifiers connects a right row line partition to a left row line partition, that the cells each comprise one field-effect transistor having its gate connected to the column lines and its source or drain to one of the row lines, and one capacitive element, that furthermore several auxiliary cells are provided, one of which is connected to one of the right or the left row line partitions, and that an input/output bus is arranged at and connected to one end of the row lines, the bus being such as to be connectable to the cells for the sense amplifiers. As the word circuits are arranged in the center of the left and the right word line, the effective word line capacity is halved. In spite of this, the word line capacity is still too high, particularly for memories with a very large number of cells per word line, so that such an approach is not suitable for very large scale integrated memories with a very high information storage capacity. As the word lines are selected only after having been discharged, there is a reduction in speed and there are very high capacitive currents leading to increased dissipation and noise problems in the matrix.

The obvious solution of dividing the entire memory matrix into several partial matrices is disadvantageous for very large scale integration because of the large number of peripheral circuits required which in turn lead to increased area equirements, dissipation power and highly complex wiring of the partial matrices.

Another solution for reducing the dissipation power and for rendering effective only particular memory parts required is described in commonly assigned U.S. Pat. No. 3,599,182, filed Jan. 15, 1969, by R. A. Henle, relating to a data storage with a plurality of storage locations, an address register and a decoder for addressing one storage location in each case for the purpose of reading stored or entering new information. This data storage is characterized in that the decoder comprises a main decoder, connected to the address register through address signal lines, and a group of decoders following the main decoder, which are all connected in parallel to further address signal lines of the address register, and that each of the decoders is associated with a switch unit for selectively connecting the respective decoder to the operating voltage, and each of the output lines of the main decoder is connected to a control node of the switch unit of one of the following decoders such that if the decoder is addressed by the address register, a signal appearing on one of the output lines of the main decoder causes only that decoder to be activated whose switch unit is connected to the respective output line. This circuit, too, has the disadvantage that the line capacities are still insufficiently low to permit short access times in very large scale integrated memories with a very high storage capacity.

To double the capacity of a memory, commonly assigned U.S. patent application having Ser. No. 423,983, filed by L. Arzubi on Sept. 27, 1982, concerns a solution for a field-effect transistor memory, wherein the outputs of the sense latch are connected to two pairs of cross-coupled charge storage elements as bit line coupling transistors, and wherein bit line pairs of double the magnitude are connected to the charge coupling elements. An additional bit line for controlling the additional cells is arranged in separate partitions, each partition having its own reference cells and being connected to the sense latch through layers, acting as low- capacity lines, and to charge coupling elements. Although, in this case, by using a second metallization layer for wiring purposes and by utilizing the self-isolating characteristics of the latches acting as read amplifiers, the number of bits per bit line is doubled without having to increase the cell size and without unduly reducing the read signal such that more peripherial circuits are required, an extension of the word lines and the specific problems related therewith is neither illustrated nor indicated, so that this approach is equally unsuitable for very large scale integrated memories with a very high storage capacity.

DISCLOSURE OF THE INVENTION

Therefore, it is an object of the invention to provide a very large scale integrated semiconductor memory with a very high storage capacity, an extremely short access time and minimum dissipation power, whose effective word line capacities are reduced despite a substantial extension of the word lines, i.e., an increase of the number of bits per word line.

The present invention relates to a memory concept which avoids the above-described disadvantages. By dividing the word lines into several partial word lines and by introducing separately controllable word switches for each partial word line, the effective word line capacity is only 1/N of the total effective word line capacity without partitioning. For typical N numbers of 8 or 16, the cell selection power/speed ratio can be easily increased by one order of magnitude. The additional space requirements of the several word driver transistors are negligible, considering that, for example, 16 cells may be connected to one partial word line. It is also worth mentioning that the word switches of MTL memories may be included in the cell pocket to reduce the space requirements still further. The additional word control line, which extends parallel to the partitioned word lines and which jointly controls all word switches of a word, requires practically no additional space particularly in MTL technology but also with multilayer metallization. In addition, their low power requirements permit designing the word switch transistors as so-called minimum transistors rather than as power transistors. In MTL memories, the word switch transistors may be integrated in the same pocket as the cells. A further great advantage is that the voltage drop along the word line is substantially reduced owing to its low current and very short length. As a result, the differences in the word line switching levels are small. Noise on the lines for the entire chip is substantially reduced, so that the various characteristics of such a chip are considerably improved. In addition, several X-word control lines may be combined by partitioning the nodes to the Y-word control lines and by increasing the Y-word control lines accordingly. This ensures optimum partitioning of the word lines in the entire memory array. In addition, the load for the drivers of the X- and the Y-control lines is optimally redistributed, thus yielding a good speed/power ratio for the memory. At particular speeds, there are minimum area requirements for the cell array and the peripheral circuits, as the line widths do not have to be increased and, as a result of the reduced currents, minimum widths are sufficient even for very long selection lines.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
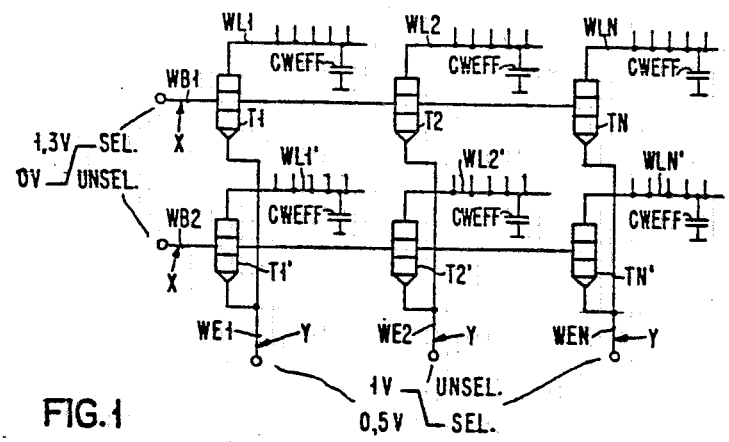
FIG. 1 is a basic circuit diagram of a memory array with partitioned word lines.

The circuit diagram of FIG. 1 shows a word-organized memory matrix with partitioned word lines WL and additional word control lines WB and WE. The word lines WL of the entire memory cell matrix are divided into several word lines WL1, WL2, ..., WLN, and each partial word line is controlled by a separate word switch in the form of a transistor T1, T2, ..., TN.

Parallel to the word lines WL1, WL2, ..., WLN thus partitioned, the memory structure comprises an additional word control line WB which jointly controls all word switches T1, T2, ..., TN of a word. For each word group controlled by a partitioned word line WL1, WL2, ..., WLN there is generally a further word control line WE extending perpendicularly thereto. In multilayer technology, the two X-Y-word control lines may be arranged in separate layers and extend parallel to each other. An individual partial word line, e.g., WL1, is selected by X-Y-controlling the respective word switch, e.g., T1, with the aid of the associated word control lines, e.g., WB1 and WE1. As a result of this circuit measure, the effective word line capacity is only 1/N of the total effective word line capacity of an existing memory without the above-described word line partitioning.

For typical orders of magnitude of N, say, 8 or 16, the power/speed ratio of a semiconductor memory thus designed may be improved by one order of magnitude. The additional space requirements for the several word driver transistors are negligible, if, for example, 16 cells are associated with one partial word line. In MTL memories, for example, the word switches may be integrated in the cell pocket, which further reduces the total space required.

Figure 2:
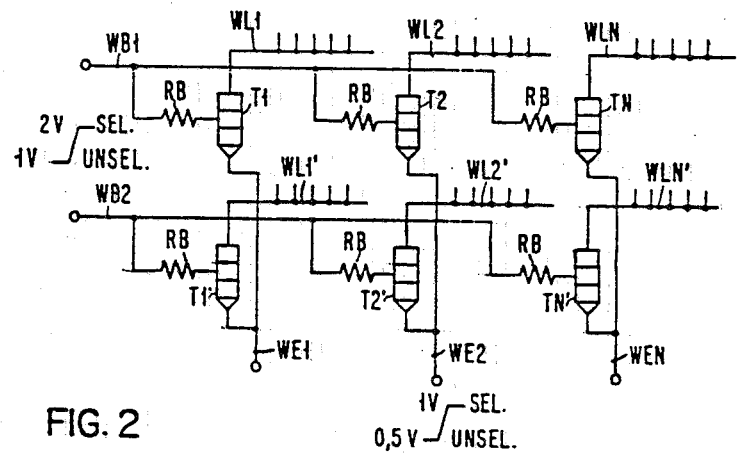
FIG. 2 is a basic circuit diagram showing that the principle according to FIG. 1 may also be used for cell arrays with a positive word line selection pulse.

FIG. 2 concerns a further embodiment showing that the word line partitioning principle described with reference to FIG. 1 may also be used for cell arrays with a positive word line selection pulse, such as bipolar cross-coupled multi-emitter transistor cells. The only difference between the latter circuit and that of FIG. 1 is that the word control lines WB1, WB2, ... are not directly connected to the base of the word switches T1, T2, ..., TN but across a resistor RB for decoupling selected and unselected word control lines, e.g., WB1, WB2 and WE1, WE2, respectively. The NPN transistors used for the word switches in this instance may be replaced by PNP transistors.

Figure 3:
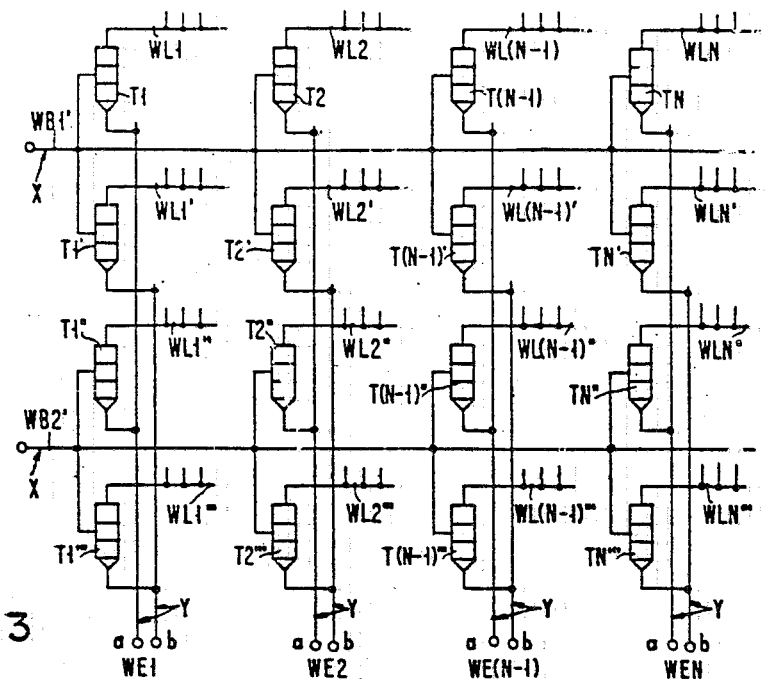
FIG. 3 is a basic circuit diagram of a memory matrix with partitioned word lines and combined X-word control lines.

FIG. 3 shows a further modified embodiment of a semiconductor memory, wherein two or several X-word control lines are combined by the nodes to the Y-word control lines being suitably partitioned and the number of Y-word control lines being increased accordingly. Thus, an X-word control line, e.g., WB1', is connected to the bases of at least two word switches T1 and T1', whereas the Y-word control line WE1a, b is connected to the emitter of a word switch T1 or T1' associated with the X-word control line WB1'. This additionally facilitates optimizing the partitioning of the word lines in the entire memory array. This principle may be used to advantage, for example, if as a result of a given cell matrix there is only very little space for additional X-control lines WB and additional Y- control lines WEa, b may be accommodated at little expenditure. A further advantage is that the load for the drivers of the X- and the Y-control lines may be optimally redistributed, thus yielding an optimum memory speed/power under given conditions.

Figure 4:
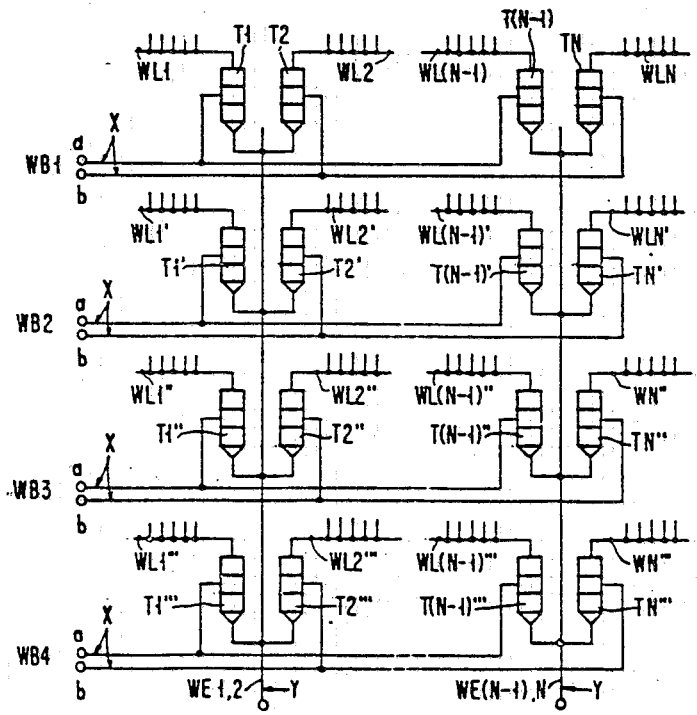
FIG. 4 is a memory matrix with partitioned word lines and combined Y-word control lines.

FIG. 4 shows a further variant of the memory principle, which can be used to advantage for conditions other than those in FIG. 3. The depicted binary arrangement comprises combined Y-word control lines WE1, 2 and correspondingly increased X-control lines WBa and b. Thus, a Y-word control line WE is in each case connected to the emitters of the word switches T1 and T2 associated with a partitioned word control line, e.g., WB1a and b, whereas the partitioned X-word control lines WBa and b are in each case connected to one base of these word switches T1 and T2. This shows that the principle of having several word line partitions permits optimum array partitioning suiting the respective physical layout and the electrical parameters, such as, capacitances and resistances, of the memory matrix as well as the external and internal organization of the memory chip. As a result, the power/speed ratio of the respective memory chip is considerably improved and there are minimum area requirements.

While the invention has been particularly shown and described with reference to preferred embodiments thereof, it will be understood by those skilled in the art that various changes in form and details may be made therein without departing from the spirit and scope of the invention.

What is claimed is:
1. A semiconductor memory comprising a plurality of word lines, each of said lines including a plurality of word line segments, a plurality of word switches, each of said switches being connected to a respective one of said word line segments, a plurality of first control lines, one of said control lines being coupled to each of said word switches connected to one of said word lines, a plurality of second control lines, each of said second control lines being coupled to at least one of said plurality of word switches, and means connected to said first and second control lines for selecting the switches connected to said one word line.

2. A semiconductor memory as set forth in claim 1 wherein one of said plurality of first control lines is coupled to the switches connected to two word lines and each of said second control lines includes first and second line segments, each of said first line segments being coupled to the switches of a first group of word lines and each of the switches of said second line segment being coupled to the switches of a second group of word lines.

3. A semiconductor memory as set forth in claim 1 wherein one of said plurality of second control lines is coupled to two switches of each of said plurality of word lines and each of said first control lines includes first and second line segments, each of said first line segments being coupled to the switches of a first group of word line segments of one of said plurality of word lines and each of said second line segments being coupled to the switches of a second group of word line segments of said one of said plurality of word lines.

4. A semiconductor memory as set forth in claim 1 further including a plurality of resistors, each of said resistors being interposed between a respective one of said switches and an associated one of said plurality of control lines.

5. A semiconductor memory as set forth in claim 1 wherein each of said switches is a bipolar transistor with said first control lines being coupled to the bases of said transistors and said second control lines being coupled to the emitters of said transistors.

6. Semiconductor memory with cells arranged at the cross point of word and bit lines and which are selected via selection circuits and control lines comprising a plurality of word switches, each of said word lines having several partial word lines, each of said partial word lines being connected to a respective one of said word switches, a plurality of first word control lines connected to said switches and a plurality of second word control lines connected to said switches.

7. A semiconductor memory as set forth in claim 6 wherein one of said plurality of first word control lines is coupled to the switches connected to two of said word lines and each of said second word control lines includes first and second segments, each of said first segments being connected to the switches of a first group of word lines and each of said second segments being connected to the switches of a second group of word lines.

8. A semiconductor memory as set forth in claim 6 wherein one of said plurality of second word lines is connected to two switches of each of said plurality of word lines and each of said first word control lines includes first and second segments, each of said first segments being connected to the switches of a first group of partial word lines of one of said plurality of word lines and each of said second segments being connected to the switches of a second group of partial word lines of said one of said plurality of word lines.

9. A semiconductor memory as set forth in claim 6 wherein each of said switches is a transistor and further including a plurality of resistors, each of said resistors being connected between a control electrode of a respective one of said transistors and an associated one of said plurality of control lines.

10. A semiconductor memory as set forth in claim 9 wherein each of said transistors is a bipolar transistor with said first control lines being coupled to the bases of said transistors and said second word control lines being connected to the emitters of said transistors.

* * * * *